(12) United States Patent
Sang et al.

(10) Patent No.: US 11,965,931 B1
(45) Date of Patent: Apr. 23, 2024

(54) DUMMY DUAL IN-LINE MEMORY MODULE (DIMM) TESTING SYSTEM BASED ON BOUNDARY SCAN INTERCONNECT AND METHOD THEREOF

(71) Applicants: Inventec (Pudong) Technology Corporation, Shanghai (CN); Inventec Corporation, Taipei (TW)

(72) Inventors: Yuan Sang, Shanghai (CN); Xiao-Xiao Mao, Shanghai (CN); Jin-Dong Zhao, Shanghai (CN)

(73) Assignees: Inventec (Pudong) Technology Corporation, Shanghai (CN); Inventec Corporation, Taipei (TW)

( * ) Notice: Subject to any disclaimer, the term of this patent is extended or adjusted under 35 U.S.C. 154(b) by 0 days.

(21) Appl. No.: 18/064,067

(22) Filed: Dec. 9, 2022

(30) Foreign Application Priority Data

Nov. 17, 2022 (CN) .......................... 202211439396.0

(51) Int. Cl.
*G01R 31/28* (2006.01)
*G01R 31/3185* (2006.01)

(52) U.S. Cl.
CPC .............. *G01R 31/318597* (2013.01); *G01R 31/31855* (2013.01); *G01R 31/318555* (2013.01); *G01R 31/318572* (2013.01)

(58) Field of Classification Search
CPC ...... G01R 31/318597; G01R 31/31855; G01R 31/31908; G01R 31/318555; G01R 31/318572
See application file for complete search history.

(56) References Cited

U.S. PATENT DOCUMENTS

| | | | | |
|---|---|---|---|---|
| 6,675,332 B1 * | 1/2004 | Suzuki | ..................... | G06F 11/24 714/E11.154 |
| 6,834,366 B2 * | 12/2004 | Kim | ..................... | G11C 29/1201 714/30 |
| 6,934,898 B1 * | 8/2005 | Goff | ..................... | G06F 11/221 714/E11.161 |
| 7,406,641 B2 * | 7/2008 | Day | ..................... | G01R 31/318555 714/726 |
| 7,509,549 B2 * | 3/2009 | Larson | ..................... | G06F 11/2242 714/724 |
| 7,551,508 B2 * | 6/2009 | Joshi | ..................... | G11C 11/417 365/228 |
| 7,590,910 B2 * | 9/2009 | Haroun | ..................... | G01R 31/2851 714/734 |

(Continued)

*Primary Examiner* — Esaw T Abraham
(74) *Attorney, Agent, or Firm* — David R. Stevens; Stevens Law Group (57) ABSTRACT

A dummy dual in-line memory module (DIMM) testing system based on boundary scan interconnect and a method thereof. A dummy dual in-line memory module functioning normally is used as a test fixture, a dummy dual in-line memory module under test is served as an unit under test (UUT), and the test fixture and the unit under test are inserted into a test device to electrically connect to each other, so that the test access port (TAP) device can perform boundary scan to control the test fixture to test the unit under test through signal pins, and check a test result based on a data signal collected from at least one boundary scan register. Therefore, the effect of improving testing convenience of the dummy DIMM can be achieved.

10 Claims, 6 Drawing Sheets

(56) References Cited

U.S. PATENT DOCUMENTS

| | | | | |
|---|---|---|---|---|
| 7,702,981 B2* | 4/2010 | Grealish | ............. | G01R 31/312 |
| | | | | 714/736 |
| 10,255,150 B2* | 4/2019 | Kim | .................. | G06F 11/079 |
| 10,867,689 B2* | 12/2020 | Spica | ................... | G11C 29/38 |
| 2008/0315902 A1* | 12/2008 | Kobayashi | ............. | G11C 5/143 |
| | | | | 324/756.03 |

* cited by examiner

DUMMY DUAL IN-LINE MEMORY MODULE (DIMM) TESTING SYSTEM BASED ON BOUNDARY SCAN INTERCONNECT AND METHOD THEREOF

CROSS-REFERENCE TO RELATED APPLICATION

This application claims the benefit of Chinese Application Serial No. 202211439396.0, filed Nov. 17, 2022, which is hereby incorporated herein by reference in its entirety.

BACKGROUND OF THE INVENTION

1. Field of the Invention

The present invention relates to a test system and a method thereof, more particularly to a dummy dual in-line memory module (DIMM) testing system based on boundary scan interconnect (BSI), and a method thereof.

2. Description of the Related Art

In recent years, there is a lack of a systematic test solution for produced dummy dual in-line memory module (DIMM), so defective boards may enter a production line to cause considerable trouble to a production department.

Specifically, the factory lacks a board diagnostic solution for the failure of an entire dummy dual in-line memory module or the continuous error reporting for certain pin under test. Therefore, there is a problem that it is difficult to locate faults (such as open-circuit fault or short-circuit fault) and inconvenient to test a dummy dual in-line memory module, and this problem affects production cost and time.

According to above-mentioned contents, what is needed is to develop an improved technical solution to solve the problem that it is inconvenient to test a dummy dual in-line memory module.

SUMMARY OF THE INVENTION

An objective to the present invention is to disclose a dummy dual in-line memory module testing system based on boundary scan interconnect and a method thereof, to solve the conventional problem.

In order to achieve the objective, the present invention discloses a dummy dual in-line memory module testing system based on boundary scan interconnect, include a dummy dual in-line memory module, a dummy dual in-line memory module under test, a test access port (TAP) device and a test device. The dummy dual in-line memory module is served as a test fixture, wherein all functions of the test fixture are normal. The dummy dual in-line memory module under test is served as a unit under test. The test access port (TAP) device is connected to a terminal machine executing a test program, wherein the test access port (TAP) device includes signal pins and is configured to transmit a control signal and receive a data signal through the signal pins, wherein the signal pins comprise a test data in pin, a test data out pin, a test clock pin, and a test mode select pin. The test device is electrically connected to the test access port (TAP) device through the signal pin, and includes a first slot, a second slot, a power supply module and a transmission module. The first slot is configured for insertion of the dummy dual in-line memory module to electrically connect the dummy dual in-line memory module to the test device. The second slot is configured for insertion of the dummy dual in-line memory module under test to electrically connect the dummy dual in-line memory module under test to the test device. The power supply module is connected a DC power supply, wherein when the test program performs a test, the power supply module makes the DC power supply continuously supply power to the first slot and the second slot, and when the test is finished, the power supply module makes the DC power supply stop supplying power to the first slot and the second slot. The transmission module is configured to receive the control signal from the test access port (TAP) device, to control the test fixture to test the unit under test through the boundary scan, wherein when the test program is executed, the transmission module transmits the data signal, which is collected from at least one boundary scan register, to the test access port (TAP) device through the signal pin, to check a test result.

In order to achieve the objective, the present invention discloses a dummy dual in-line memory module testing method based on boundary scan interconnect, wherein the dummy dual in-line memory module testing method is applied to boundary scan test environment where a dummy dual in-line memory module, a dummy dual in-line memory module under test, a test access port (TAP) device and a test device are disposed, and the dummy dual in-line memory module testing method includes steps of: inserting the dummy dual in-line memory module into the test device to serve as a test fixture, wherein all functions of the test fixture are normal; inserting the dummy dual in-line memory module under test into the test device to serve as a unit under test; electrically connecting the test access port (TAP) device to a terminal machine executing a test program, to electrically connect signal pins of the test access port (TAP) device to the test device, and transmitting a control signal to the test device through the signal pins, wherein the signal pins comprise a test data in pin, a test data out pin, a test clock pin, and a test mode select pin; connecting the test device to a DC power supply, wherein when the test program performs a test, the DC power supply continuously supplies power to the first slot and the second slot, and when the test is finished, the DC power supply stops supplying power to the first slot and the second slot; receiving the control signal from the test access port (TAP) device, to control the test fixture to test the unit under test through the boundary scan, by the test device, wherein when the test program is executed, the data signal, which is collected from at least one boundary scan register, is transmitted to the test access port (TAP) device through the signal pin, to check a test result.

According to the above-mentioned system and method of the present invention, the difference between conventional technology and the present invention is that, in the present invention, the dummy dual in-line memory module functioning normally is used as the test fixture, the dummy dual in-line memory module under test is served as the unit under test (UUT), and the test fixture and the unit under test are inserted into the test device to electrically connect to each other, so that the test access port (TAP) device can perform the boundary scan to control the test fixture to test the unit under test through the signal pins, and check the test result based on the data signal collected from the at least one boundary scan register.

According to the above-mentioned solution, the present invention is able to achieve the effect of improving testing convenience for the dummy DIMM.

BRIEF DESCRIPTION OF THE DRAWINGS

The structure, operating principle and effects of the present invention will be described in detail by way of various embodiments which are illustrated in the accompanying drawings.

DETAILED DESCRIPTION OF THE PREFERRED EMBODIMENTS

The following embodiments of the present invention are herein described in detail with reference to the accompanying drawings. These drawings show specific examples of the embodiments of the present invention. These embodiments are provided so that this disclosure will be thorough and complete, and will fully convey the scope of the invention to those skilled in the art. It is to be acknowledged that these embodiments are exemplary implementations and are not to be construed as limiting the scope of the present invention in any way. Further modifications to the disclosed embodiments, as well as other embodiments, are also included within the scope of the appended claims.

These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts. As used herein, the singular forms "a", "an" and "the" are intended to include the plural forms as well, unless the context clearly indicates otherwise.

It is to be acknowledged that, although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present disclosure. As used herein, the term "or" includes any and all combinations of one or more of the associated listed items.

It will be acknowledged that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present.

In addition, unless explicitly described to the contrary, the words "comprise" and "include", and variations such as "comprises", "comprising", "includes", or "including", will be acknowledged to imply the inclusion of stated elements but not the exclusion of any other elements.

Embodiments of the present invention will be illustrated in detail in the following paragraphs with reference to the accompanying drawings. These embodiments are provided so that the process of applying technical solution of the present invention to solve a technical problem to achieve technical effect will be thorough and complete, and will fully convey the scope of the invention to those skilled in the art.

Figure 1:
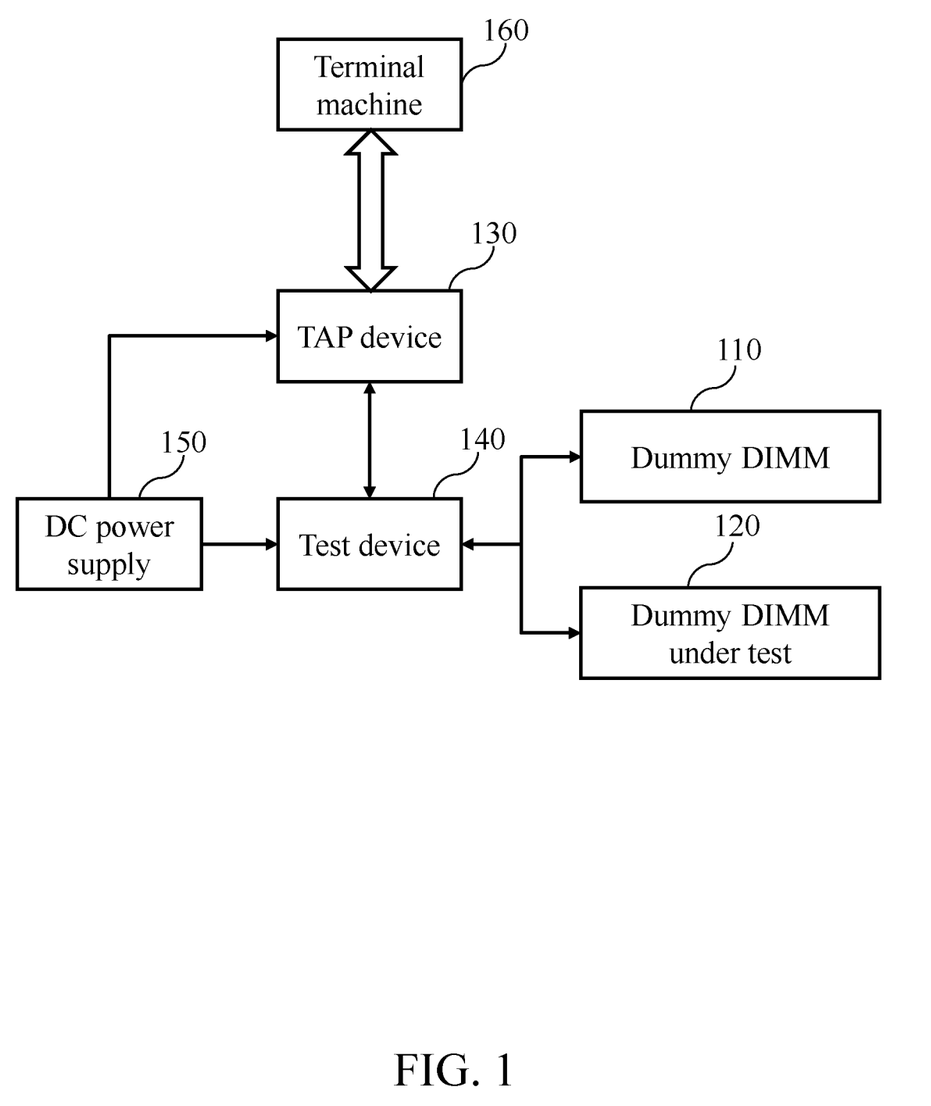
FIG. 1 is a system block diagram of a dummy dual in-line memory module testing system based on boundary scan interconnect, according to the present invention.

Please refer to FIG. 1, which is a system block diagram of a dummy dual in-line memory module testing system based on boundary scan interconnect, according to the present invention. As shown in FIG. 1, the dummy dual in-line memory module testing system includes a dummy dual in-line memory module 110, a dummy dual in-line memory module under test 120, a test access port (TAP) device 130, and a test device 140. The dummy dual in-line memory module 110 is served as a test fixture, all functions of the test fixture are normal. In other words, the dummy dual in-line memory module 110 is a memory module which is confirmed to function normally. In actual implementation, the test fixture can include a complex programmable logic device; in an embodiment, the test fixture can also include a switch device.

The dummy dual in-line memory module under test 120 is served as a unit under test (UUT). In other words, the dummy dual in-line memory module under test 120 is a memory module which has not yet confirmed whether the function is normal or not, and the dummy dual in-line memory module under test 120 is also a memory module under test. In actual implementation, the unit under test can include complex programmable logic devices, and the unit under test can further include a micro control unit (MCU) and a switch device, the micro control unit controls an enable pin of the switch device to electrically connect the test data out pin of the unit under test to the test data in pin of the test fixture to form a joint test action group (JTAG) link, and the micro control unit scans registers of the complex programmable logic device through the joint test action group (JTAG) link, to perform an integrity test. In addition, multiplex pins can be located between the unit under test and the switch device of the test fixture, IO channels can be located between the UUT and the complex programmable logic device of the test fixture, each of the complex programmable logic devices controls the switch device connected thereto to strobes the corresponding one of the IO channels, to test transceiving functions of all the IO channel. In greater detail, each of the UUT and the test fixture includes an analog-to-digital (AD) converter, the test device supplies power to the analog-to-digital (AD) converter, and provide different power supply voltages to adjacent pins of the analog-to-digital (AD) converter. The complex programmable logic device of the test fixture controls the switch device connected thereto to strobe the IO channel and set the multiplex pin at a high logic level, the complex programmable logic device of the UUT controls the switch device connected thereto to strobe an AD channel, and the micro control unit controls the analog-to-digital (AD) converter to collect voltages.

The test access port (TAP) device 130 is connected to a terminal machine 160 executing a test program, the test access port (TAP) device 130 includes signal pins, transmits a control signal and receives a data signal through the signal pins. The signal pins include a test data in pin (abbreviated as TDI), a test data out pin (abbreviated as TDO), a test clock pin (abbreviated as TCK), and a test mode select pin (abbreviated as TMS). In actual implementation, the test access port (TAP) device 130 is also a JTAG access interface, and includes a signal (such as a serial signal) pin, an internal state machine and a register; the signal pin is configured to communicate with an outside device. In an embodiment, the signal pin controls the state machine to access the register, all JTAG functions can be completed through the four pins; for example, an operation clock is inputted through the TCK, a status transfer is selected through the TMS, and the status transfer is operated at a rising edge of the TCK; the serial signal is shifted into the register through TDI, and the shift is operated at a rising edge of the TCK; the serial signal is shift out of the register through TDO, and the shift operated at a falling edge of TCK, and an output is driven only when the serial signal is shifted out of the register. It is particularly to be noted that when the JTAG is serially connected in use, the TCK and the TMS share the same pin, and TDI and TDO are serially connected to each other. The registers include an instruction register and a data register, a TAP status and instruction register determines TDI to be inputted to which register and determines TDO to be outputted to which register. Specifically, the terminal machine 160 executes the test program to drive the micro control unit to compare a preset reference value with the voltages collected by the analog-to-digital (AD) converter, and output a test result based on a comparison result. The preset reference value is taken as example, a pin voltage reaches a voltage value on an input terminal of an analog-to-digital (AD) converter through a voltage divider, the voltage value is related to the pin voltage and a design of the voltage divider. In a condition that the voltage value actually collected by the pin 145 of the dummy dual in-line memory module under test 120 is 2.031765 V and a voltage provided by the pin is 12 V, when the voltage is divided by 6 times and the deviation range is set as plus or minus 10%, the reasonable range of the reference value is 2.200000 to 1.800000.

The test device 140 is electrically connected to the test access port (TAP) device 130 through the signal pins, and includes a first slot, a second slot, a power supply module, and a transmission module. The dummy dual in-line memory module 110 can be inserted into the first slot, so that the dummy dual in-line memory module 110 is electrically connected to the test device 140.

The dummy dual in-line memory module under test 120 can be inserted into the second slot, so that the dummy dual in-line memory module under test 120 is electrically connected to the test device 140. When the insertions of the dummy dual in-line memory module 110 and the dummy dual in-line memory module under test 120 are completely, the dummy dual in-line memory module 110 can be controlled to perform a test on the dummy dual in-line memory module under test 120, by an external test access port (TAP) device 130. For example, the test can be a power supply test of slot, a function test for a boundary scan register and serial connection strobe, a test for a bi-directional IO transceiving function, or an AD channel test.

The power supply module is permitted to connect to the DC power supply 150. When the test program performs a test, the DC power supply 150 continuously supplies power to the first slot and the second slot; when the test is finished, the DC power supply 150 stops supplying power to the first slot and the second slot. In actual implementation, in order to protect the dummy dual in-line memory module 110 that functions normally, the power supply module supplies power only when the test starts, and stops supplying power when the test ends. The manner of controlling the power supply can be implemented by controlling the enable pin through an external IO.

The transmission module is configured to receive the control signal from the test access port (TAP) device 130, to control the test fixture (that is, the dummy dual in-line memory module 110) to perform a test on the unit under test (that is, the dummy dual in-line memory module under test 120) through a boundary scan. When the test program is executed, the data signal, which is collected from a boundary scan register, is transmitted to the test access port (TAP) device 130 through the signal pin, to check a test result.

It is to be particularly noted that, in actual implementation, the modules/devices of the present invention can be implemented by various manners, including software, hardware or any combination thereof, for example, in an embodiment, the module or device can be implemented by software and hardware, or one of software and hardware. Furthermore, the present invention can be implemented fully or partly based on hardware, for example, one or more component of the system can be implemented by integrated circuit chip, system on chip (SOC), a complex programmable logic device (CPLD), or a field programmable gate array (FPGA). The concept of the present invention can be implemented by a system, a method and/or a computer program. The computer program can include computer-readable storage medium which records computer readable program instructions, and the processor can execute the computer readable program instructions to implement concepts of the present invention. The computer-readable storage medium can be a tangible apparatus for holding and storing the instructions executable of an instruction executing apparatus. Computer-readable storage medium can be, but not limited to electronic storage apparatus, magnetic storage apparatus, optical storage apparatus, electromagnetic storage apparatus, semiconductor storage apparatus, or any appropriate combination thereof. More particularly, the computer-readable storage medium can include a hard disk, an RAM memory, a read-only-memory, a flash memory, an optical disk, a floppy disc or any appropriate combination thereof, but this exemplary list is not an exhaustive list. The computer-readable storage medium is not interpreted as the instantaneous signal such a radio wave or other freely propagating electromagnetic wave, or electromagnetic wave propagated through waveguide, or other transmission medium (such as optical signal transmitted through fiber cable), or electric signal transmitted through electric wire. Furthermore, the computer readable program instruction can be downloaded from the computer-readable storage medium to each calculating/processing apparatus, or downloaded through network, such as internet network, local area network, wide area network and/or wireless network, to external computer equipment or external storage apparatus. The network includes copper transmission cable, fiber transmission, wireless transmission, router, firewall, switch, hub and/or gateway. The network card or network interface of each calculating/processing apparatus can receive the computer readable program instructions from network, and forward the computer readable program instruction to store in computer-readable storage medium of each calculating/processing apparatus. The computer program instructions for executing the operation of the present invention can include source code or object code programmed by assembly language instructions, instruction-set-structure instructions, machine instructions, machine-related instructions, micro instructions, firmware instructions or any combination of one or more programming language. The programming language include object oriented programming language, such as Common Lisp, Python, C++, Objective-C, Smalltalk, Delphi, Java, Swift, C #, Perl, Ruby, and PHP, or regular procedural programming language such as C language or similar programming language. The computer readable program instruction can be fully or partially executed in a computer, or executed as independent software, or partially executed in the client-end computer and partially executed in a remote computer, or fully executed in a remote computer or a server.

Figure 2:
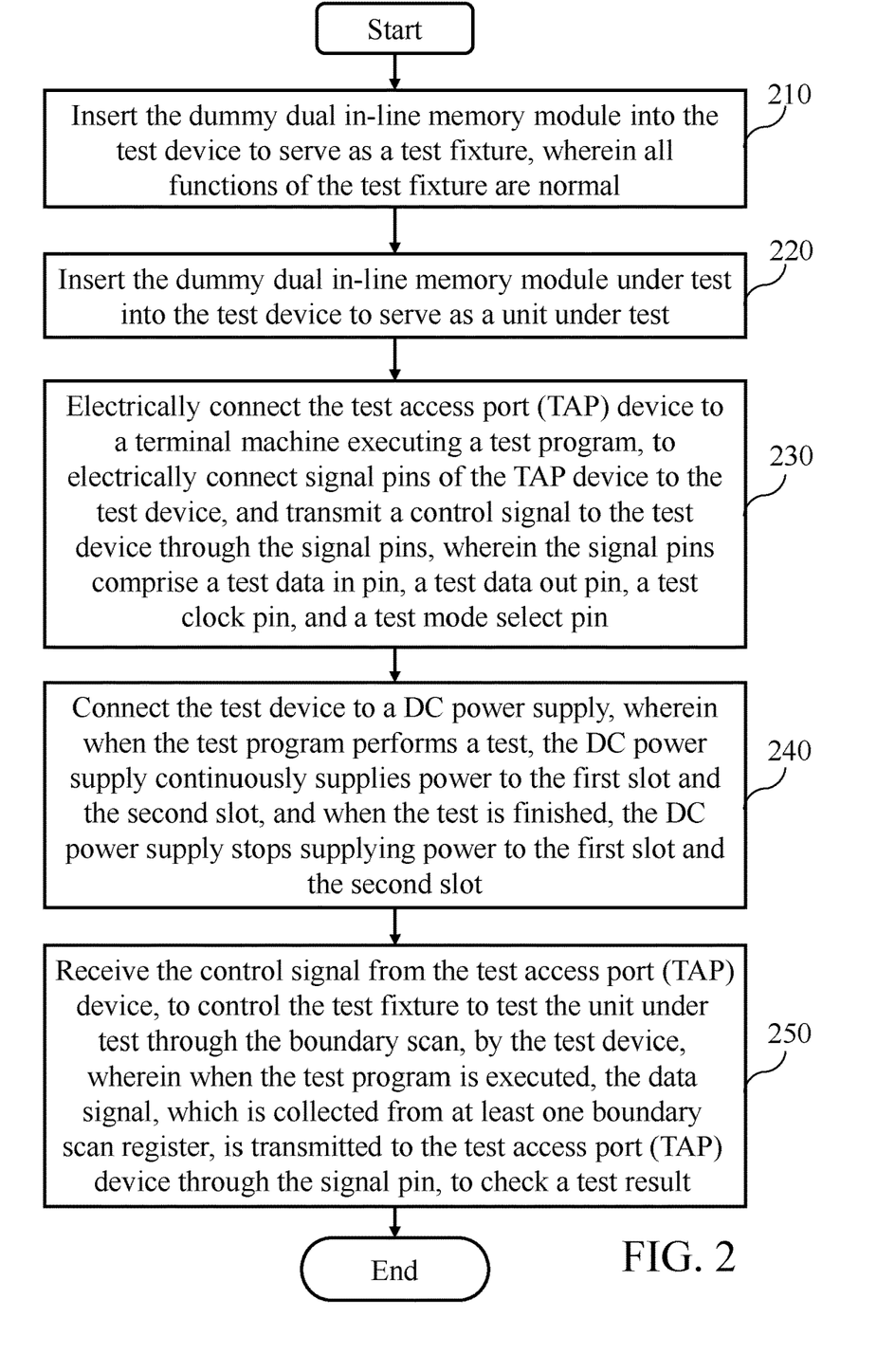
FIG. 2 is a flowchart of a dummy dual in-line memory module testing method based on boundary scan interconnect, according to the present invention.
Figure 3:
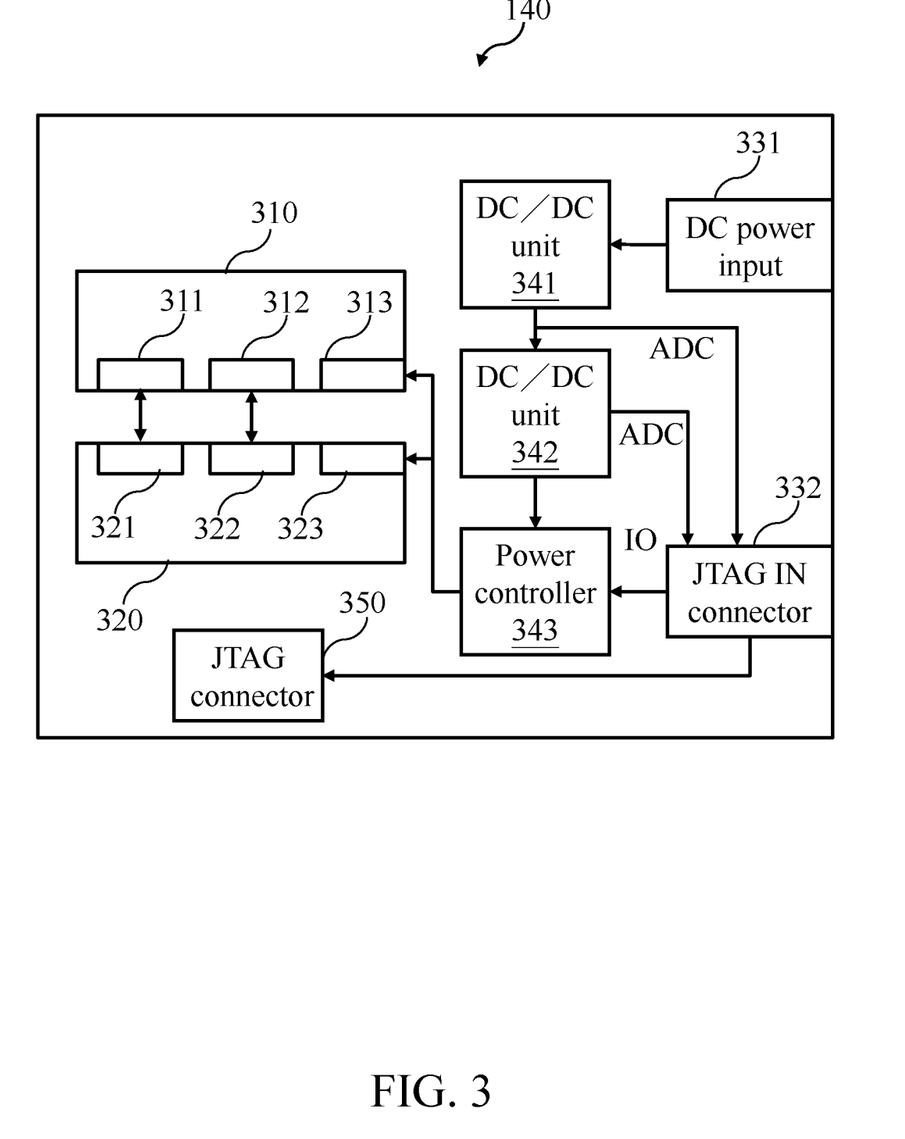
FIG. 3 is a schematic diagram of a test device, according to the present invention.

Please refer to FIG. 2, which is a flowchart of a dummy dual in-line memory module testing method based on boundary scan interconnect, according to the present invention. As shown in FIG. 2, the dummy dual in-line memory module testing method is applied to boundary scan test environment where a dummy dual in-line memory module 110, a dummy dual in-line memory module under test 120, a test access port (TAP) device 130 and a test device 140 are disposed, and the dummy dual in-line memory module testing method includes the following steps. In a step 210, the dummy dual in-line memory module 110 is inserted into the test device 140 to serve as a test fixture, wherein all functions of the test fixture are normal. In a step 220, the dummy dual in-line memory module under test 120 is inserted into the test device 140 to serve as a unit under test. In a step 230, the test access port (TAP) device 130 is electrically connected to a terminal machine 160 executing a test program, to electrically connect signal pins of the test access port (TAP) device 130 to the test device 140, and a control signal is transmitted to the test device 140 through the signal pins, wherein the signal pins comprise a test data in pin, a test data out pin, a test clock pin, and a test mode select pin. In a step 240, the test device is connected to a DC power supply, when the test program performs a test, the DC power supply continuously supplies power to the first slot and the second slot, and when the test is finished, the DC power supply stops supplying power to the first slot and the second slot. In a step 250, the test device 140 receives the control signal is received from the test access port (TAP) device 130, to control the test fixture to test the unit under test through the boundary scan, wherein when the test program is executed, the data signal, which is collected from at least one boundary scan register, is transmitted to the test access port (TAP) device 130 through the signal pin, to check a test result. Therefore, the dummy dual in-line memory module functioning normally can be used as the test fixture, the dummy dual in-line memory module under test can be served as the unit under test (UUT), and the test fixture and the unit under test are inserted into the test device to electrically connect to each other, so that the test access port (TAP) device can perform the boundary scan to control the test fixture to test the UUT through the signal pins, and check the test result based on the data signal collected from the at least one boundary scan register.

Embodiments of the present invention will be illustrated in the following paragraphs with reference to FIGS. 3 to 6. Please refer to FIG. 3, which is a schematic diagram of a test device, according to the present invention. In actual implementation, the test device 140 is a circuit board device including a first slot 310, a second slot 320, a DC power input 331, a JTAG IN connector 332, DC/DC units 341 and 342, a power controller 343, and a JTAG connector 350. The first slot 310 includes an IO signal pin 311, a ground pin 312, and a power pin 313; similarly, the second slot 320 includes an IO signal pin 321, a ground pin 322 and a power pin 323. When the DC power supply 150 is electrically connected to the DC power input 331, the power is transmitted through the DC/DC units 341 and 342, such as a DC boost LDO or a DC buck LDO. The power controller 343 determines whether to supply power to the first slot 310 and the second slot 320. In practice, the IO signal pins 311 and 321 are electrically connected directly to transmit IO signal. The ground pins 312 and 322 are directly electrically connected to each other. The JTAG IN connector 332 is electrically connected to the signal pin of the test access port (TAP) device 130 and configured to receive the control signal and transmit the data signal. The JTAG connector 350 is electrically connected to the JTAG IN pin of the dummy dual in-line memory module under test 120.

Figure 4:
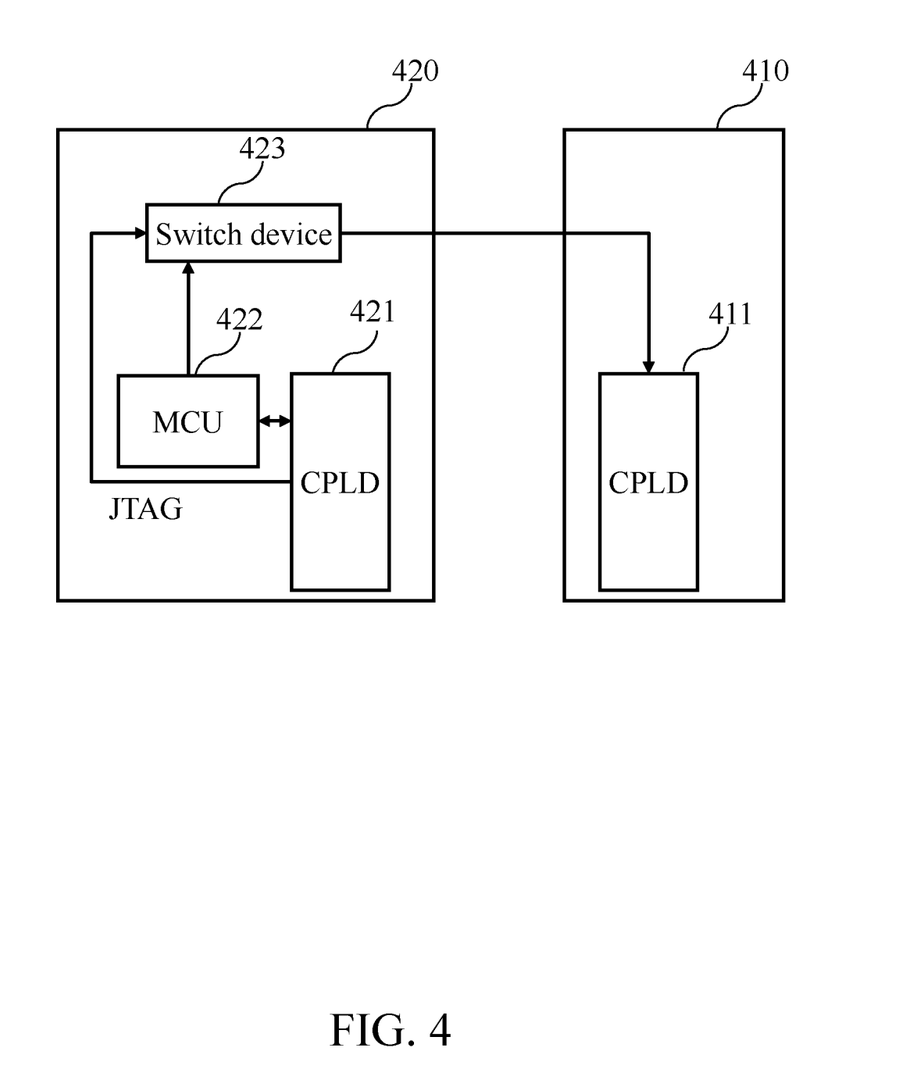
FIG. 4 is a schematic diagram of an operation of executing a test for a function of a CPLD boundary scan register, according to the present invention.

As shown in FIG. 4, which is a schematic diagram of an operation of executing a function test for CPLD boundary scan register, according to the present invention. In actual implementation, the dummy dual in-line memory module 410 includes a CPLD 411; the dummy dual in-line memory module under test 420 includes a CPLD 421, a micro control unit 422 (MCU) and a switch device 423. The micro control unit 422 of the dummy dual in-line memory module under test 420 controls the enable pin of the switch device 423 to communicate the TDO of the dummy dual in-line memory module under test 420 and the TDI of the dummy dual in-line memory module 410, to implement the physical connection of the JTAG link between the two memory modules. Therefore, the integrity test can be performed when the operation of the system is switched to the boundary scan register.

Figure 5:
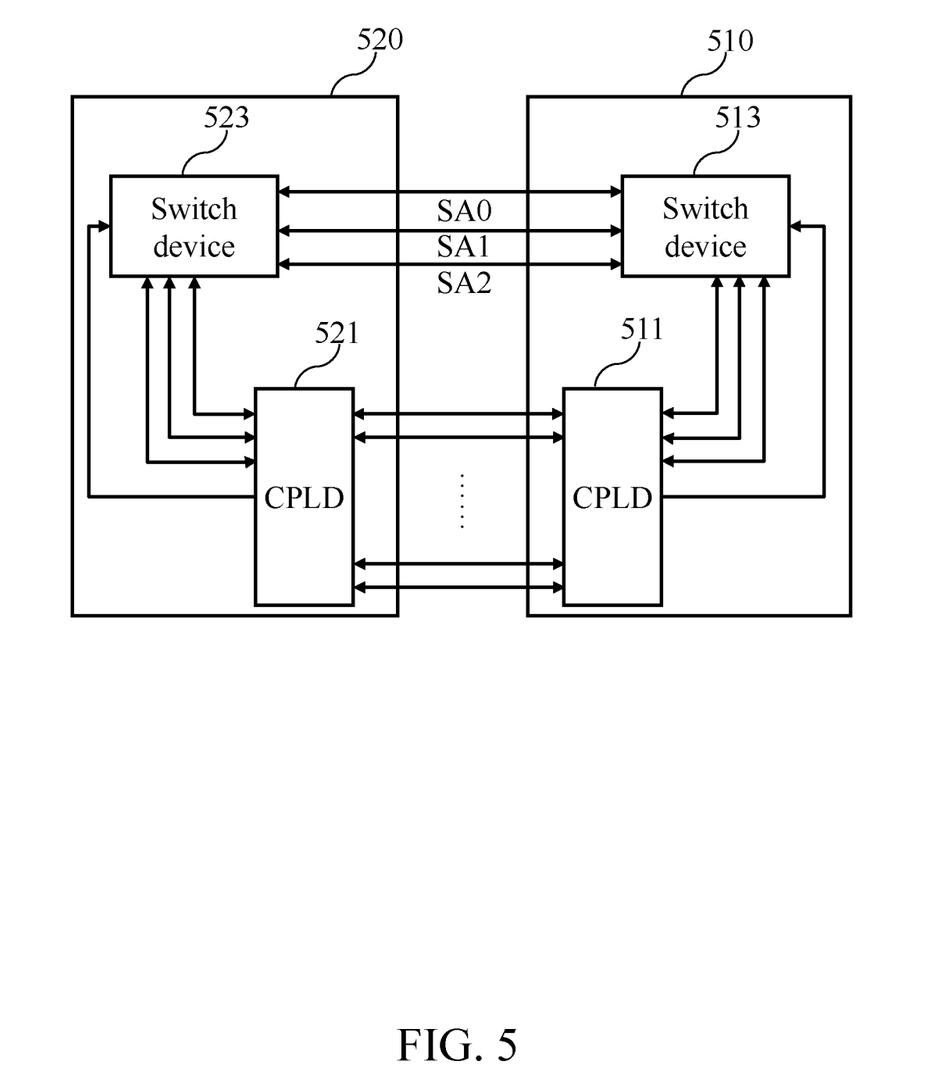
FIG. 5 is a schematic diagram of an operation of executing a test for a bi-directional transceiving function of a CPLD boundary scan 10, according to the present invention.

As shown in FIG. 5, which is a schematic diagram of an operation of testing a bi-directional transceiving function of the CPLD boundary scan 10, according to the present invention. In actual implementation, the dummy dual in-line memory module 510 includes a CPLD 511 and a switch device 513, the dummy dual in-line memory module under test 520 also includes a CPLD 521 and a switch device 523, the IOs of the CPLD 511 and the IO of the CPLD 521 are electrically connected to each other directly, there are three multiplex pins SA0 to SA2 are disposed between the switch device 513 and the switch device 523. In this case, the CPLDs 511 and 521 controls the switch device 513 and 523 connected thereto, respectively, to strobe the IO channels, to test transceiving functions of the all IO channels.

Figure 6:
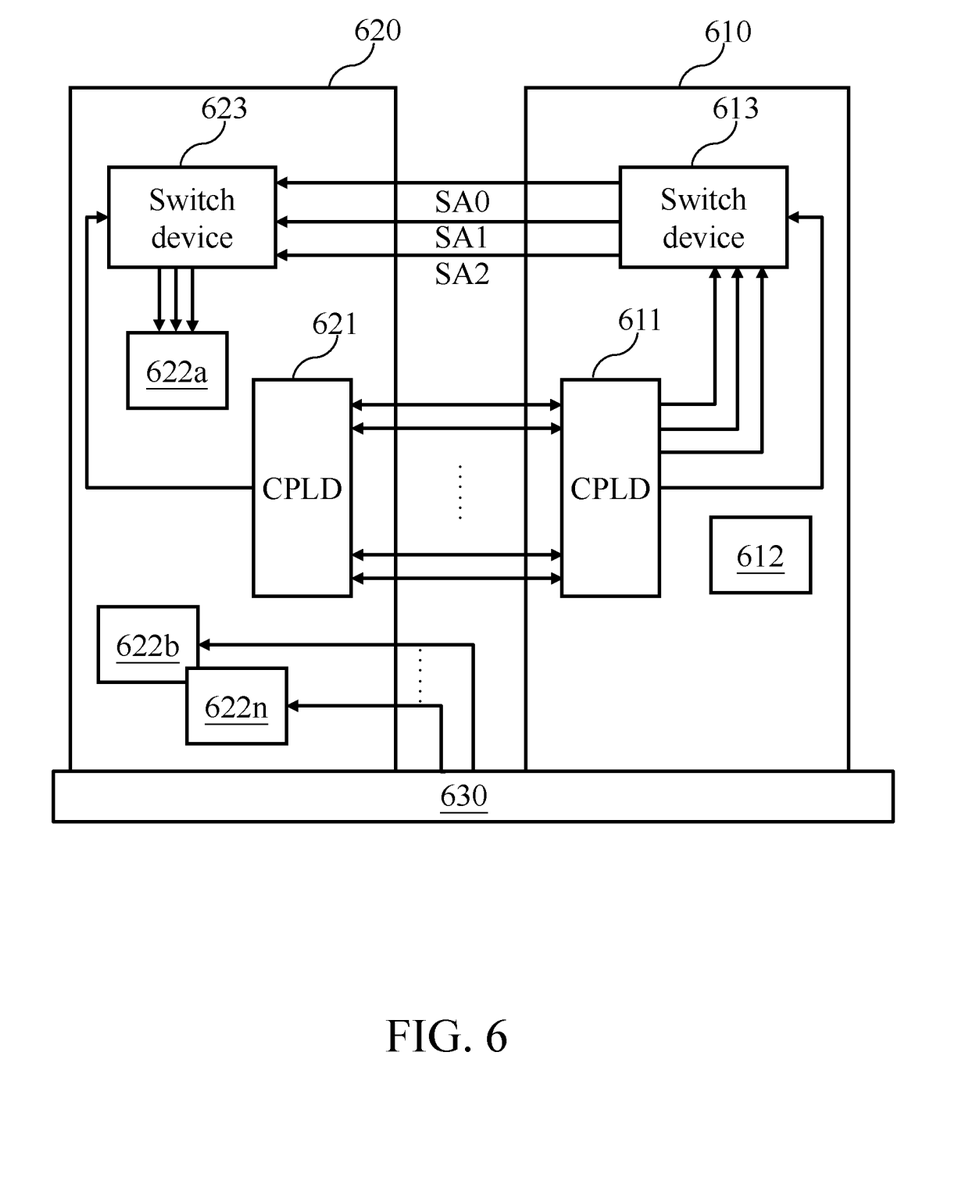
FIG. 6 is a schematic diagram of an operation of executing a function test for an analog-to-digital (AD) converter, according to the present invention.

As shown in FIG. 6, which is a schematic diagram of an operation of executing a function test for an analog-to-digital (AD) converter, according to the present invention. In actual implementation, the dummy dual in-line memory module 610 includes a CPLD 611, a switch device 613 and an analog-to-digital (AD) converter 612; similarly, the dummy dual in-line memory module under test 620 includes a CPLD 621, a switch device 623 and analog-to-digital (AD) converters 622a~622n. The IO of the CPLD 611 and the IO of the CPLD 621 are electrically connected to each other directly, and three multiplex pins SA0 to SA2 are disposed between the switch device 613 and the switch device 623. The difference between FIGS. 5 and 6 is that a DC/DC unit 630 of the test device 140 supplies power to the power pins electrically connected to the analog-to-digital (AD) converter 622a~622n in FIG. 6, and the power supply voltages on adjacent pins are different, so as to effectively detect short-circuit failure during the test. The CPLD 611 of the dummy dual in-line memory module 610 controls the switch device 613 to strobe the IO channel, and the three conductive lines SA0 to SA2 are set at a high logic level. The CPLD 621 of the dummy dual in-line memory module under test 620 controls the switch device 623 to strobe the AD channel. The single chip or the micro control unit can control the analog-to-digital (AD) converters 622a~622n to collect voltages, compare the reference value with the collected voltages, and output a test result based on a comparison result. For example, the result indicative of different comparison results means that failure exists, so the test result is a faulty product; the result indicative of the same comparison results means that there is no fault, and the test result is a good product. It should be explained that, in fact, only the analog-to-digital (AD) converters 622a~622n of the dummy dual in-line memory module under test 620 are collected, and the analog-to-digital (AD) converter 612 of the dummy dual in-line memory module 610 is not collected.

According to above-mentioned contents, the difference between the present invention and the conventional technology is that, in the present invention, the dummy dual in-line memory module functioning normally is used as the test fixture, the dummy dual in-line memory module under test is served as the UUT, and the test fixture and the unit under test are inserted into the test device to electrically connect to each other, so that the TAP device can perform the boundary scan to control the test fixture to test the unit under test through the signal pins, and check the test result based on the data signal collected from the at least one boundary scan register. Therefore, the above-mentioned solution or the present invention is able to solve the conventional technical problem, so as to achieve the effect of improving testing convenience for the dummy DIMM.

The present invention disclosed herein has been described by means of specific embodiments. However, numerous modifications, variations and enhancements can be made thereto by those skilled in the art without departing from the spirit and scope of the disclosure set forth in the claims.

What is claimed is:

1. A dummy dual in-line memory module testing system based on a boundary scan interconnect, comprising:
   a dummy dual in-line memory module, served as a test fixture, wherein all functions of the test fixture are normal;
   a dummy dual in-line memory module under test, served as a unit under test;
   a test access port (TAP) device, connected to a terminal machine executing a test program, wherein the test access port (TAP) device comprises signal pins and is configured to transmit a control signal and receive a data signal through the signal pins, wherein the signal pins comprise a test data in pin, a test data out pin, a test clock pin, and a test mode select pin; and
   a test device, electrically connected to the test access port (TAP) device through the signal pin, and comprising:
      a first slot, configured for insertion of the dummy dual in-line memory module to electrically connect the dummy dual in-line memory module to the test device;
      a second slot, configured for insertion of the dummy dual in-line memory module under test to electrically connect the dummy dual in-line memory module under test to the test device;
      a power supply module, connected a DC power supply, wherein when the test program performs a test, the power supply module makes the DC power supply continuously supply power to the first slot and the second slot, and when the test is finished, the power supply module makes the DC power supply stop supplying power to the first slot and the second slot; and
      a transmission module, configured to receive the control signal from the test access port (TAP) device, to control the test fixture to test the unit under test through the boundary scan, wherein when the test program is executed, the transmission module transmits the data signal, which is collected from at least one boundary scan register, to the test access port (TAP) device through the signal pin, to check a test result.

2. The dummy dual in-line memory module testing system based on boundary scan interconnect according to claim 1, wherein each of the unit under test and the test fixture comprises a complex programmable logic device, the unit under test comprises a micro control unit and a switch device, the micro control unit is configured to control an enable pin of the switch device, to electrically connect the test data out pin of the unit under test to the test data in pin of the test fixture to form a joint test action group (JTAG) link, and scan registers of the complex programmable logic device to perform an integrity test through the joint test action group (JTAG) link.

3. The dummy dual in-line memory module testing system based on boundary scan interconnect according to claim 2, wherein the test fixture comprises the switch device, and multiplex pins are disposed between the unit under test and the switch device of the test fixture, at least one IO channel is formed between the complex programmable logic devices of the unit under test and the test fixture, each of the complex programmable logic devices controls the switch device connected thereto to strobe the corresponding one of the at least one IO channel, to test a transceiving function of the at least one IO channel.

4. The dummy dual in-line memory module testing system based on boundary scan interconnect according to claim 3, wherein each of the unit under test and the test fixture comprises at least one analog-to-digital (AD) converter, the test device supplies power to the analog-to-digital (AD) converters, and the power supply module provides different power supply voltages to adjacent pins of each of the analog-to-digital (AD) converters, the complex programmable logic device of the test fixture controls the switch device connected thereto to strobe the corresponding one of the at least one IO channel and set the corresponding one of the multiplex pins at a high logic level, the complex programmable logic device of the unit under test controls the switch device connected thereto to strobe at least one AD channel, and the micro control unit controls all of the analog-to-digital (AD) converters to collect voltages.

5. The dummy dual in-line memory module testing system based on boundary scan interconnect according to claim 4, wherein the terminal machine executes the test program to drive the micro control unit to compare the preset reference value with the voltages collected by the analog-to-digital (AD) converter, and output the test result based on a comparison result.

6. A dummy dual in-line memory module testing method based on boundary scan interconnect, wherein the dummy dual in-line memory module testing method is applied to boundary scan test environment where a dummy dual in-line memory module, a dummy dual in-line memory module under test, a test access port (TAP) device and a test device are disposed, and the dummy dual in-line memory module testing method comprises:
   inserting the dummy dual in-line memory module into the test device to serve as a test fixture, wherein all functions of the test fixture are normal;
   inserting the dummy dual in-line memory module under test into the test device to serve as a unit under test;
   electrically connecting the test access port (TAP) device to a terminal machine executing a test program, to electrically connect signal pins of the test access port (TAP) device to the test device, and transmitting a control signal to the test device through the signal pins, wherein the signal pins comprise a test data in pin, a test data out pin, a test clock pin, and a test mode select pin;

connecting the test device to a DC power supply, wherein when the test program performs a test, the DC power supply continuously supplies power to the first slot and the second slot, and when the test is finished, the DC power supply stops supplying power to the first slot and the second slot;

receiving the control signal from the test access port (TAP) device, to control the test fixture to test the unit under test through the boundary scan, by the test device, wherein when the test program is executed, the data signal, which is collected from at least one boundary scan register, is transmitted to the test access port (TAP) device through the signal pin, to check a test result.

7. The dummy dual in-line memory module testing method based on boundary scan interconnect according to claim 6, wherein each of the unit under test and the test fixture comprises a complex programmable logic device, the unit under test comprises a micro control unit and a switch device, the micro control unit is configured to control an enable pin of the switch device, to electrically connect the test data out pin of the unit under test to the test data in pin of the test fixture to form a joint test action group (JTAG) link, and scan registers of the complex programmable logic device to perform an integrity test through the joint test action group (JTAG) link.

8. The dummy dual in-line memory module testing method based on boundary scan interconnect according to claim 7, wherein the test fixture comprises the switch device, and multiplex pins are disposed between the unit under test and the switch device of the test fixture, at least one IO channel is formed between the complex programmable logic devices of the unit under test and the test fixture, each of the complex programmable logic devices controls the switch device connected thereto to strobe the corresponding one of the at least one IO channel, to test a transceiving function of the at least one IO channel.

9. The dummy dual in-line memory module testing method based on boundary scan interconnect according to claim 8, wherein each of the unit under test and the test fixture comprises at least one analog-to-digital (AD) converter, the test device supplies power to the analog-to-digital (AD) converters, and the power supply module provides different power supply voltages to adjacent pins of each of the analog-to-digital (AD) converters, the complex programmable logic device of the test fixture controls the switch device connected thereto to strobe the corresponding one of the at least one IO channel and set the corresponding one of the multiplex pins at a high logic level, the complex programmable logic device of the unit under test controls the switch device connected thereto to strobe at least one AD channel, and the micro control unit controls all of the analog-to-digital (AD) converters to collect voltages.

10. The dummy dual in-line memory module testing method based on boundary scan interconnect according to claim 9, wherein the terminal machine executes the test program to drive the micro control unit to compare the preset reference value with the voltages collected by the analog-to-digital (AD) converter, and output the test result based on a comparison result.

* * * * *